US011887878B2

(12) United States Patent
Rao et al.

(10) Patent No.: US 11,887,878 B2
(45) Date of Patent: Jan. 30, 2024

(54) DETACHABLE BIASABLE ELECTROSTATIC CHUCK FOR HIGH TEMPERATURE APPLICATIONS

(71) Applicant: APPLIED MATERIALS, INC., Santa Clara, CA (US)

(72) Inventors: Shreesha Yogish Rao, Milpitas, CA (US); Mukund Sundararajan, Bangalore (IN); Cheng-Hsiung Matthew Tsai, Cupertino, CA (US); Manjunatha P. Koppa, Bengaluru (IN); Steven V. Sansoni, Livermore, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 798 days.

(21) Appl. No.: 16/899,750

(22) Filed: Jun. 12, 2020

(65) Prior Publication Data

US 2020/0411354 A1 Dec. 31, 2020

Related U.S. Application Data

(60) Provisional application No. 62/868,246, filed on Jun. 28, 2019.

(51) Int. Cl.
*H01L 21/683* (2006.01)
*H01J 37/32* (2006.01)

(52) U.S. Cl.
CPC .... *H01L 21/6833* (2013.01); *H01J 37/32724* (2013.01); *H01J 2237/002* (2013.01); *H01J 2237/334* (2013.01)

(58) Field of Classification Search
CPC ............ H01L 21/6833; H01J 37/32724; H01J 2237/002; H01J 2237/334
See application file for complete search history.

(56) References Cited

U.S. PATENT DOCUMENTS

D375,961 S 11/1996 Kotlarek
5,691,876 A 11/1997 Chen et al.
(Continued)

FOREIGN PATENT DOCUMENTS

JP 2003142359 A * 5/2003
JP 2003197726 A 7/2003
(Continued)

OTHER PUBLICATIONS

International Search Report for PCT/US2020/038538 dated Oct. 6, 2020.

(Continued)

*Primary Examiner* — Yuechuan Yu
(74) *Attorney, Agent, or Firm* — MOSER TABOADA

(57) ABSTRACT

Embodiments of a substrate support are provided herein. In some embodiments, a substrate support for use in a substrate processing chamber includes a lower assembly having a base plate assembly, wherein the base plate assembly includes a plurality of electrical feedthroughs disposed about a central protrusion; a ceramic puck disposed on the lower assembly and removeably coupled to the base plate assembly, wherein the ceramic puck has an electrode disposed therein that is electrically coupled to first pair of electrical feedthroughs of the plurality of electrical feedthroughs; and a flexible connector having a spiral portion disposed between the ceramic puck and each of the plurality of electrical feedthroughs to allow for differences in thermal expansion of the ceramic puck and the base plate assembly.

19 Claims, 5 Drawing Sheets

(56) References Cited

U.S. PATENT DOCUMENTS

| | | | |
|---|---|---|---|
| 6,046,885 | A | 4/2000 | Aimonetti |
| 6,159,055 | A | 12/2000 | Satitpunwaycha et al. |
| 6,310,755 | B1 | 10/2001 | Kholodenko et al. |
| 6,324,743 | B1 | 12/2001 | Gonnet |
| 6,462,928 | B1 | 10/2002 | Shamouilian et al. |
| 6,673,651 | B2 | 1/2004 | Ohuchi |
| 6,853,533 | B2 | 2/2005 | Parkhe |
| 7,324,307 | B2 | 1/2008 | Brink |
| 7,361,230 | B2 * | 4/2008 | Natsuhara ......... H01L 21/68714 118/724 |
| 7,589,950 | B2 | 9/2009 | Parkhe et al. |
| 7,697,260 | B2 | 4/2010 | Brown et al. |
| D616,390 | S | 5/2010 | Sato |
| D623,500 | S | 9/2010 | Langner |
| D707,257 | S | 6/2014 | Song |
| 9,668,873 | B2 | 6/2017 | Winslow |
| D793,816 | S | 8/2017 | Alteslaben |
| D802,546 | S | 11/2017 | Jang |
| D836,399 | S | 12/2018 | Ko |
| 10,609,994 | B2 | 4/2020 | Vanderminden |
| D893,441 | S | 8/2020 | Rao |
| D916,037 | S | 4/2021 | Okajima |
| 2004/0055540 | A1 * | 3/2004 | Kanno ................ H01L 21/6831 118/724 |
| 2005/0152089 | A1 | 7/2005 | Matsuda |
| 2006/0133907 | A1 | 6/2006 | Bullock |
| 2010/0039747 | A1 | 2/2010 | Sansoni et al. |
| 2011/0309724 | A1 | 12/2011 | Min |
| 2016/0148828 | A1 | 5/2016 | Parkhe |
| 2017/0062260 | A1 | 3/2017 | Cox et al. |
| 2018/0350653 | A1 | 12/2018 | Jeong |

FOREIGN PATENT DOCUMENTS

| | | | |
|---|---|---|---|
| JP | 2005032842 | A | 2/2005 |
| JP | 2013-191826 | A | 9/2013 |
| JP | 6428456 | B2 | 11/2015 |
| TW | D159673 | | 4/2014 |
| TW | D183006 | | 5/2017 |
| TW | D193794 | | 11/2018 |
| TW | D196097 | | 2/2019 |
| WO | WO 2017-168116 | A1 | 10/2017 |

OTHER PUBLICATIONS

Search Report for Taiwan Design Application No. 108308059, dated Sep. 15, 2020.

* cited by examiner

DETACHABLE BIASABLE ELECTROSTATIC CHUCK FOR HIGH TEMPERATURE APPLICATIONS

CROSS-REFERENCE TO RELATED APPLICATIONS

This application claims benefit of U.S. provisional patent application Ser. No. 62/868,246, filed Jun. 28, 2019 which is herein incorporated by reference in its entirety.

FIELD

Embodiments of the present disclosure generally relate to substrate processing systems, and more specifically, to a substrate support for use in substrate processing systems.

BACKGROUND

Substrate supports are used for providing support to substrates within substrate processing systems, such as a plasma processing chamber. A type of substrate support includes an electrostatic chuck coupled to a lower assembly. An electrostatic chuck generally includes one or more electrodes embedded within a ceramic chuck body. The electrostatic chuck generally includes holes to flow heat transfer fluid such as a gas from the lower assembly to between a support surface of the electrostatic chuck and a backside of the substrate.

An electrostatic chuck may be detachable from the lower assembly to reduce preventative maintenance time and reduce cost of replacement. However, for high temperature applications, the electrostatic chuck can have misalignment and thermal expansion effects with respect to feedthrough connections with the lower assembly.

Accordingly, the inventors have provided an improved substrate support.

SUMMARY

Embodiments of a substrate support are provided herein. In some embodiments, a substrate support for use in a substrate processing chamber includes a lower assembly having a base plate assembly, wherein the base plate assembly includes a plurality of electrical feedthroughs disposed about a central protrusion; a ceramic puck disposed on the lower assembly and removeably coupled to the base plate assembly, wherein the ceramic puck has an electrode disposed therein that is electrically coupled to a first pair of electrical feedthroughs of the plurality of electrical feedthroughs; and a flexible connector having a spiral portion disposed between the ceramic puck and each of the plurality of electrical feedthroughs to allow for differences in thermal expansion of the ceramic puck and the base plate assembly.

In some embodiments, a substrate support for use in a substrate processing chamber includes a base plate assembly, wherein the base plate assembly includes a central protrusion and a plurality of openings disposed about the central protrusion; an electrical feedthrough disposed in each of the plurality of openings; a ceramic puck removeably coupled to the base plate assembly via fasteners coupled to a respective floating nut, wherein the ceramic puck has a first side for receiving a substrate and a second side opposite the first side having an interface ring extending from the second side, and wherein, when coupled, the base plate assembly and the ceramic puck contact each other only at an interface between the central protrusion and the interface ring; an electrode embedded in the ceramic puck and electrically coupled to a first pair of the electrical feedthroughs; and a first resistive heater embedded in the ceramic puck and electrically coupled to a second pair of the electrical feedthroughs.

In some embodiments, a process chamber includes a chamber body having a substrate support disposed within an inner volume of the chamber body, wherein the substrate support comprises a cooling plate configured to circulate a coolant therethrough; a base plate assembly disposed on the cooling plate, wherein the base plate assembly includes a plurality of electrical feedthroughs comprising a first pair of electrical feedthroughs and a second pair of electrical feedthroughs; a ceramic puck disposed on and removeably coupled to the base plate assembly, wherein the ceramic puck includes an electrode and a heater embedded therein, wherein the electrode is electrically coupled to the first pair of electrical feedthroughs and the heater is electrically coupled to the second pair of electrical feedthroughs; and a flexible connector disposed between the ceramic puck and each one of the plurality of electrical feedthroughs.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
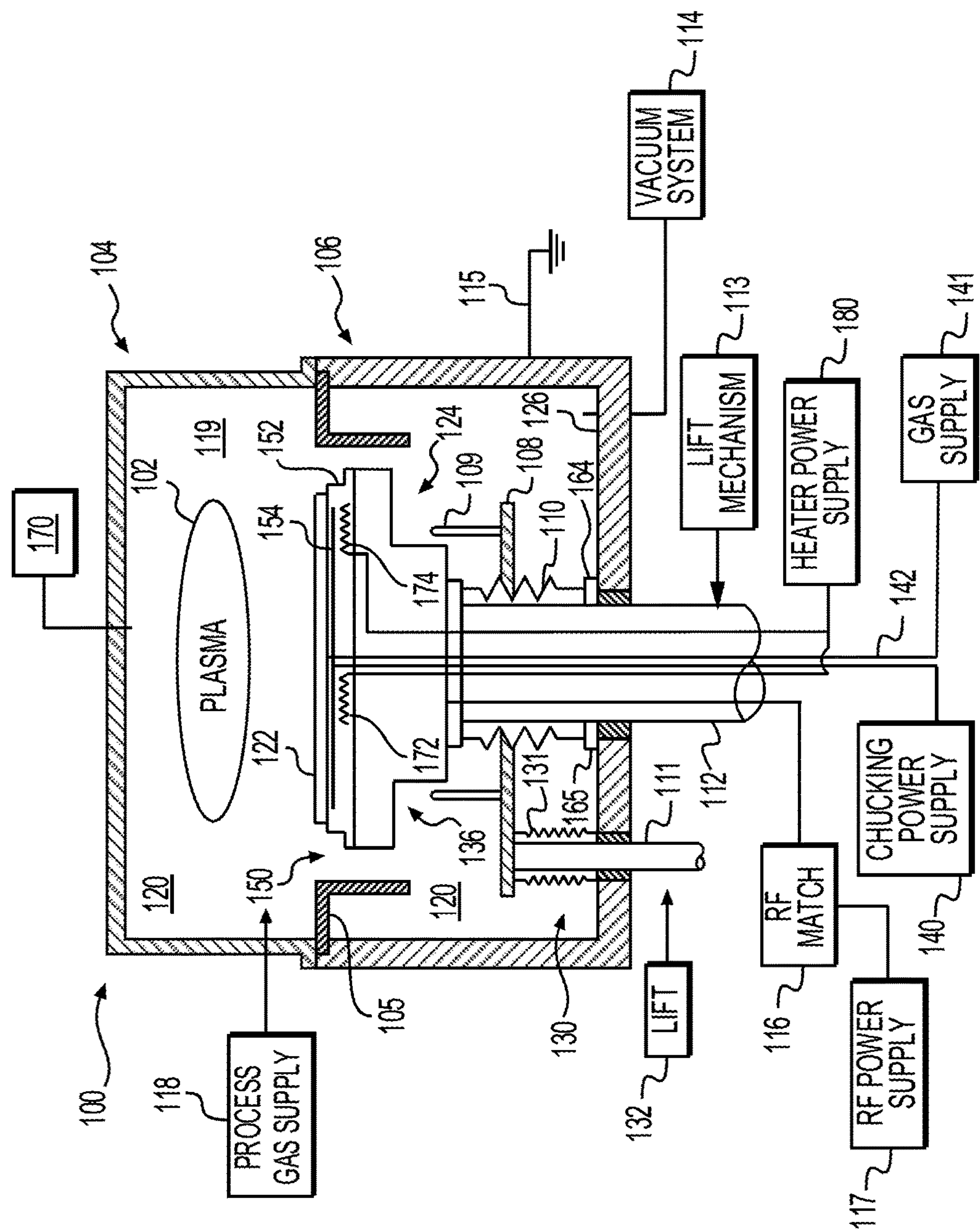
FIG. 1 depicts a schematic side view of a process chamber having a substrate support in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of substrate supports for use in a substrate processing chamber are provided herein. The substrate support includes a detachable electrostatic chuck disposed on a lower assembly. The lower assembly includes a base plate assembly coupled to a hollow shaft. The electrostatic chuck comprises a ceramic puck having a support surface to support a substrate. The ceramic puck is disposed on the base plate assembly of the lower assembly. In some embodiments, a gas channel extends from a bottom of the substrate support to a top surface of the electrostatic chuck (e.g., top surface of the ceramic puck). The gas channel is configured to provide backside gas, such as nitrogen (N) or helium (He) or argon (Ar), to the top surface of the electrostatic chuck to act as a heat transfer medium.

The electrostatic chuck includes one or more embedded electrodes. In some embodiments, the electrostatic chuck includes one or more heating elements. The base plate assembly houses a plurality of electrical feedthroughs configured to provide power to electronic components in the electrostatic chuck. In some embodiments, the electrical feedthroughs are rated for high voltage applications. In some embodiments, the electrical feedthroughs have a DC power rating of up to about 1.5 kV and DC current rating of up to about 7.5 A. In some embodiments, the electrostatic chuck is heated to up to 450 degrees Celsius.

FIG. 1 depicts a schematic side view of a process chamber (e.g., a plasma processing chamber) having an electrostatic chuck in accordance with at least some embodiments of the present disclosure. In some embodiments, the plasma processing chamber is an etch processing chamber. However, other types of processing chambers configured for different processes can also use or be modified for use with embodiments of the electrostatic chuck described herein.

The chamber 100 is a vacuum chamber which is suitably adapted to maintain sub-atmospheric pressures within a chamber interior volume 120 during substrate processing. The chamber 100 includes a chamber body 106 covered by a lid 104 which encloses a processing volume 119 located in the upper half of chamber interior volume 120. The chamber 100 may also include one or more shields 105 circumscribing various chamber components to prevent unwanted reaction between such components and ionized process material. The chamber body 106 and lid 104 may be made of metal, such as aluminum. The chamber body 106 may be grounded via a coupling to ground 115.

A substrate support 124 is disposed within the chamber interior volume 120 to support and retain a substrate 122, such as a semiconductor wafer, for example, or other such substrate as may be electrostatically retained. The substrate support 124 may generally comprise an electrostatic chuck 150 disposed on a lower assembly 136. The lower assembly 136 includes a hollow support shaft 112 for supporting the electrostatic chuck 150. The electrostatic chuck 150 comprises a ceramic puck 152 having one or more electrodes 154 disposed therein. The hollow support shaft 112 provides a conduit to provide, for example, backside gases, process gases, fluids, coolants, power, or the like, to the electrostatic chuck 150.

In some embodiments, the hollow support shaft 112 is coupled to a lift mechanism 113, such as an actuator or motor, which provides vertical movement of the electrostatic chuck 150 between an upper, processing position (as shown in FIG. 1) and a lower, transfer position (not shown). The lower assembly 136 includes a bellows assembly 110 disposed about the hollow support shaft 112, The bellows assembly 110 is coupled between the electrostatic chuck 150 and a bottom surface 126 of chamber 100 to provide a flexible seal that allows vertical motion of the electrostatic chuck 150 while preventing loss of vacuum from within the chamber 100. The bellows assembly 110 also includes a lower bellows flange 164 in contact with an o-ring 165 or other suitable sealing element which contacts the bottom surface 126 to help prevent loss of chamber vacuum.

The hollow support shaft 112 provides a conduit for coupling a backside gas supply 141, a chucking power supply 140, and RF sources (e.g., RF plasma power supply 170 and RF bias power supply 117) to the electrostatic chuck 150. The backside gas supply 141 is disposed outside of the chamber body 106 and supplies gas to the electrostatic chuck 150 via gas conduit 142 to control the temperature or pressure and/or a temperature profile or pressure profile on the support surface of the electrostatic chuck 150 during use. In some embodiments, RF plasma power supply 170 and RF bias power supply 117 are coupled to the electrostatic chuck 150 via respective RF match networks (only RF match network 116 shown). In some embodiments, the substrate support 124 may alternatively include AC, DC, or RF bias power.

A substrate lift 130 can include lift pins 109 mounted on a platform 108 connected to a shaft 111 which is coupled to a second lift mechanism 132 for raising and lowering the substrate lift 130 so that the substrate 122 may be placed on or removed from the electrostatic chuck 150. The electrostatic chuck 150 may include thru-holes to receive the lift pins 109. A bellows assembly 131 is coupled between the substrate lift 130 and bottom surface 126 to provide a flexible seal which maintains the chamber vacuum during vertical motion of the substrate lift 130.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein.

A temperature of the electrostatic chuck 150 may be adjusted to control the temperature of the substrate. For example, the electrostatic chuck 150 may be heated using one or more heating elements (e.g., first heater element 172 and second heater element 174) that are embedded, such as a resistive heater. The first heater element 172 and the second heater element 174 are coupled to a heater power supply 180. The heater power supply 180 may include one power supply to provide power to both the first heater element 172 and the second heater element 174 or multiple power supplies coupled to each respective heater element.

In operation, for example, a plasma 102 may be created in the chamber interior volume 120 to perform one or more processes. The plasma 102 may be created by coupling power from a plasma power source (e.g., RF plasma power supply 170) to a process gas via one or more electrodes near or within the chamber interior volume 120 to ignite the process gas and creating the plasma 102. A bias power may also be provided from a bias power supply (e.g., RF bias power supply 117) to the one or more electrodes 154 within the electrostatic chuck 150 to attract ions from the plasma towards the substrate 122.

Figure 2:
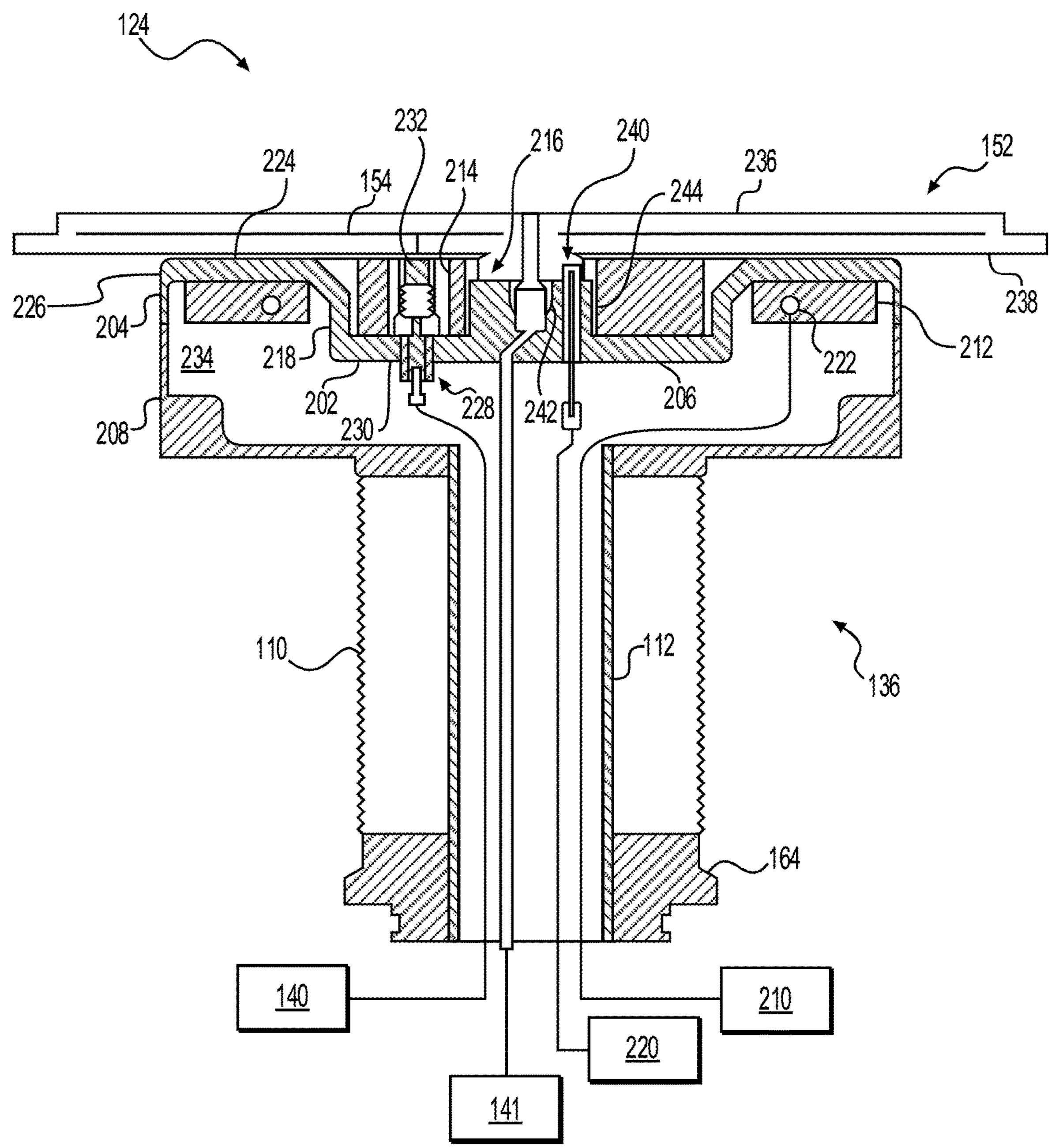
FIG. 2 depicts a schematic side view of a substrate support in accordance with at least some embodiments of the present disclosure.

FIG. 2 depicts a schematic side view of a substrate support 124 in accordance with at least some embodiments of the present disclosure. The substrate support 124 includes a ceramic puck 152 removeably coupled to the lower assembly 136. The lower assembly 136 of the substrate support 124 includes a base plate assembly 204 coupled to a lower plate 208. The lower plate 208 is coupled to the hollow support shaft 112. The base plate assembly 204, the lower plate 208, and the hollow support shaft 112 define a first plenum 234. In some embodiments, the first plenum is at atmospheric pressure during use. The ceramic puck 152 is removeably coupled to the base plate assembly 204. The ceramic puck 152 includes a first side 236, or upper surface, to support a substrate and a second side 238, or lower surface, removeably coupled to the base plate assembly 204. In some embodiments, the ceramic puck 152 is made of aluminum nitride (AlN).

In some embodiments, the base plate assembly 204 is made of a metal such as stainless steel. In some embodiments, one or more outer surfaces of the base plate assembly 204 are texturized to increase a surface emissivity of the base plate assembly 204. The increased surface emissivity enhances heat dissipation from the chuck to the base plate assembly 204. In some embodiments, the base plate assembly 204 may be texturized via a suitable mechanical or chemical process, for example, by sandblasting or grit blasting. In some embodiments, the base plate assembly 204 includes a central plate 202 and a central protrusion 216 extending upwards from an upper surface of the central plate 202. In some embodiments, the central protrusion 216 has a cylindrical shape. In some embodiments, the base plate assembly 204 further includes a first leg 218 extending upwards from the central plate 202 in the same direction as the central protrusion 216. In some embodiments, the base plate assembly 204 includes a second leg 224 extending radially outwards from the first leg 218. In some embodiments, the base plate assembly 204 includes an outer lip 226 extending downwards from the second leg 224 towards the central plate 202. In some embodiments, the lower plate 208 is coupled to the outer lip 226 of the base plate assembly 204. The central protrusion 216 includes a central opening 242 coupled to the backside gas supply 141.

The central plate 202 includes a plurality of openings 230 about the central protrusion 216. An electrical feedthrough 228 is disposed in each opening of the plurality of openings 230. In some embodiments, a terminal 232 extends outwards from the second side 238 of the ceramic puck 152 opposite each of the electrical feedthroughs 228 to electrically couple each of the electrical feedthroughs 228 to an electronic component in the ceramic puck 152 (e.g., electrode 154, first heater element 172, second heater element 174).

In some embodiments, an isolator ring 206 is disposed on the central plate 202 and configured to electrically isolate adjacent electrical feedthroughs 228 to advantageously prevent arcing. The isolator ring 206 includes a central opening 244 disposed about the central protrusion 216. In some embodiments, the isolator ring 206 includes a plurality of openings 214 about the central opening 244 corresponding with locations of the electrical feedthroughs 228. In some embodiments, one electrical feedthrough 228 and one corresponding terminal 232 are coupled within each opening of the plurality of openings 214. In some embodiments, the isolator ring 206 is made of aluminum oxide ($Al_2O_3$). In some embodiments, the isolator ring 206 is disposed between the central protrusion 216 and the first leg 218.

In operation, the plasma 102 created in the chamber interior volume 120 may heat up the substrate and the ceramic puck 152. To cool the ceramic puck 152, in some embodiments, a cooling plate 212 is disposed between the base plate assembly 204 and the lower plate 208 and coupled to the base plate assembly. The cooling plate 212 includes a channel 222 coupled to a coolant source 210 and configured to circulate a coolant through the channel 222 to cool the cooling plate 212. In some embodiments, the coolant is water. The base plate assembly 204 and the ceramic puck 152 may be cooled by the cooling plate 212 via conduction and radiation. In some embodiments, the cooling plate 212 is made of nickel-plated copper, or stainless steel. In some embodiments, the cooling plate 212 is disposed between the central plate 202 and the second leg 224. In some embodiments, the cooling plate 212 is disposed between the central plate 202 and the outer lip 226 of the base plate assembly 204.

In some embodiments, a thermocouple 240 is disposed in the ceramic puck 152 to measure a temperature of the ceramic puck 152. The thermocouple 240 is coupled to a controller 220, such as a PID controller, to advantageously control a temperature of the ceramic puck 152 and maintain thermal stability. To increase a temperature of the ceramic puck 152, one or more heating elements (e.g., first heater element 172, second heater element 174) are energized. To decrease a temperature of the ceramic puck 152, electrical power supplied to the heating elements is decreased. Coolant circulated through the cooling plate 212 additionally helps in maintaining the thermal stability of the ceramic puck 152 at a desired temperature setpoint under process conditions that use high DC/RF plasma power and high RF bias power.

Figure 3:
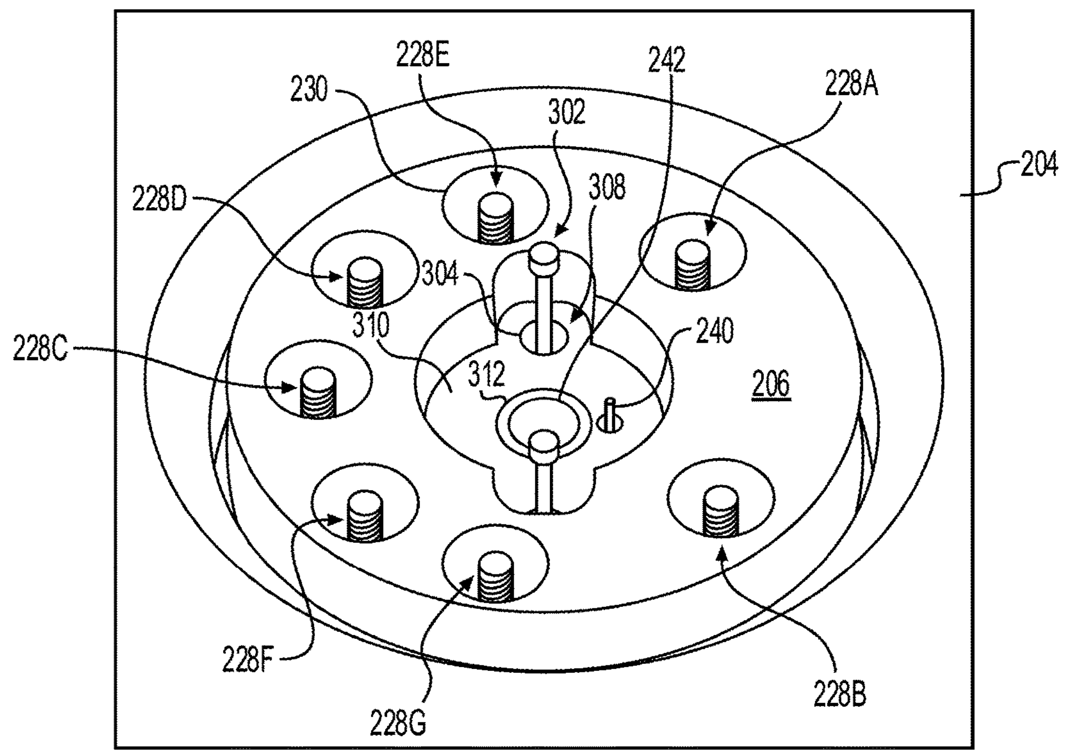
FIG. 3 depicts a partial isometric view of a base plate assembly in accordance with at least some embodiments of the present disclosure.

FIG. 3 depicts a partial isometric view of a base plate assembly in accordance with at least some embodiments of the present disclosure. In some embodiments, as shown in FIG. 3, there are seven electrical feedthroughs 228. In some embodiments, the base plate assembly 204 can accommodate more than seven or less than seven electrical feedthroughs 228. In some embodiments, a first pair of electrical feedthroughs 228A, 228B are coupled to leads of the electrode 154 at one end and to leads to the chucking power supply 140 at a second end. In some embodiments, a second pair of electrical feedthroughs 228D, 228E are coupled to leads of the first heater element 172 at one end and to leads to the heater power supply 180 at a second end. In some embodiments, a third pair of electrical feedthroughs 228A, 228B are coupled to leads of the second heater element 174 at one end and to leads to the heater power supply 180 at a second end. In some embodiments, electrical feedthrough 228C is for a center tap configured to measure a floating voltage of the substrate when a bias voltage (e.g., RF/AC bias) is applied to the substrate support 124.

In some embodiments, electrical feedthrough 228A is adjacent electrical feedthrough 228B. In some embodiments, the first pair of electrical feedthroughs 228A, 228B, the second pair of electrical feedthroughs 228D, 228E, and the third pair of electrical feedthroughs 228F, 228G are disposed about 3.0 inches to about 4.0 inches from a center (e.g., central axis 410) of the central plate 202. In some embodiments, the electrical feedthrough 228C for the central tap is disposed about 1.0 inch to about 2.0 inches from the center of the central plate 202. In some embodiments, the terminals 232 of the ceramic puck 152 are arranged similar to the electrical feedthroughs 228.

Figure 7:
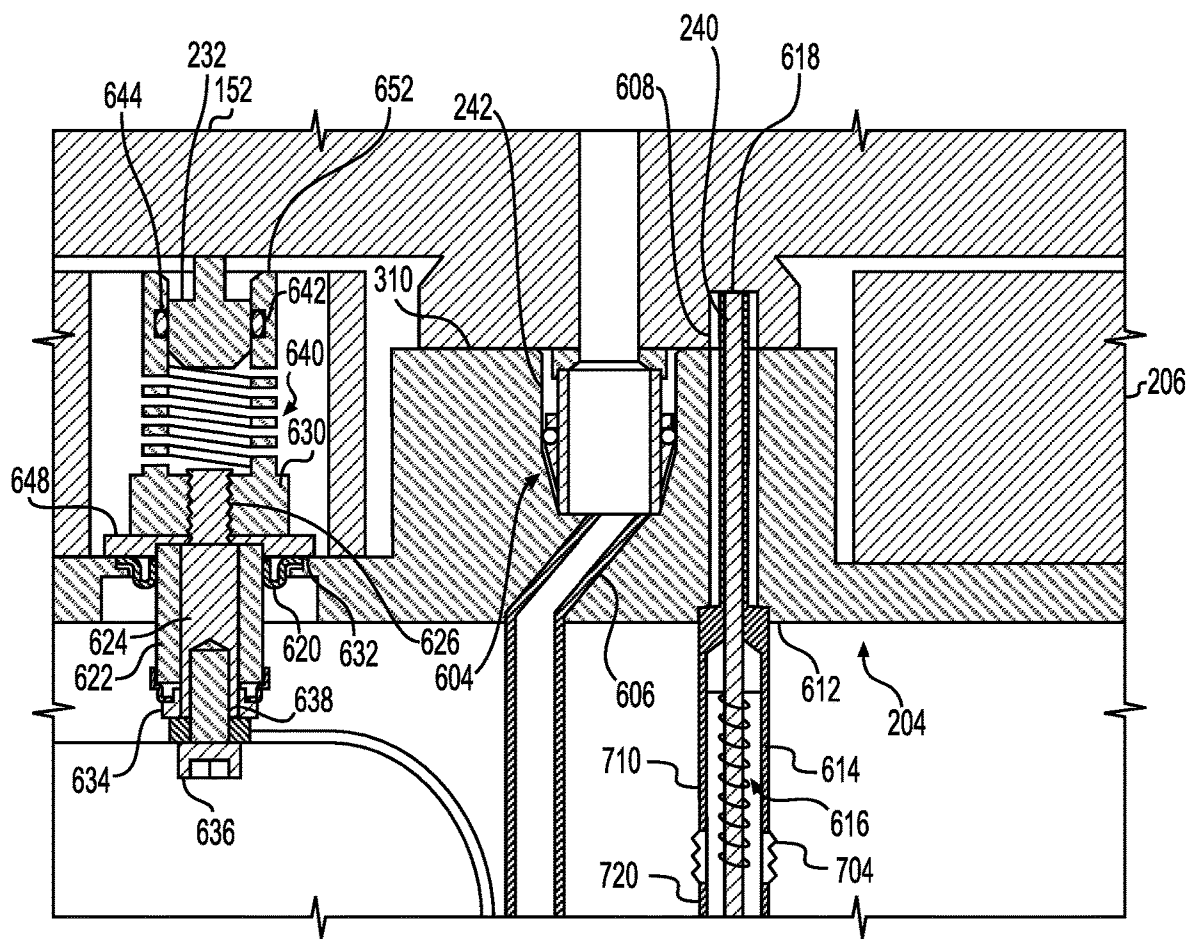
FIG. 7 depicts a cross-section view of a connection interface between a ceramic puck and a base plate assembly in accordance with at least some embodiments of the present disclosure.

In some embodiments, the base plate assembly 204 includes upper tabs 308 extending radially outwards from the central protrusion 216. In some embodiments, the upper tabs 308 are two upper tabs 308 diametrically opposed about the central protrusion. In some embodiments, the upper tabs 308 include an opening 304 to accommodate a fastener 302 therethrough. In some embodiments, an upper surface 310 of the central protrusion 216 includes a raised lip 312 about the central opening 242. In some embodiments, the raised lip 312 defines a contact surface between the base plate assembly 204 and the ceramic puck 152. In some embodiments, as shown in FIG. 7, the upper surface 310 of the central protrusion 216 is flat to advantageously provide a better seal between the base plate assembly 204 and the ceramic puck 152.

Figure 4:
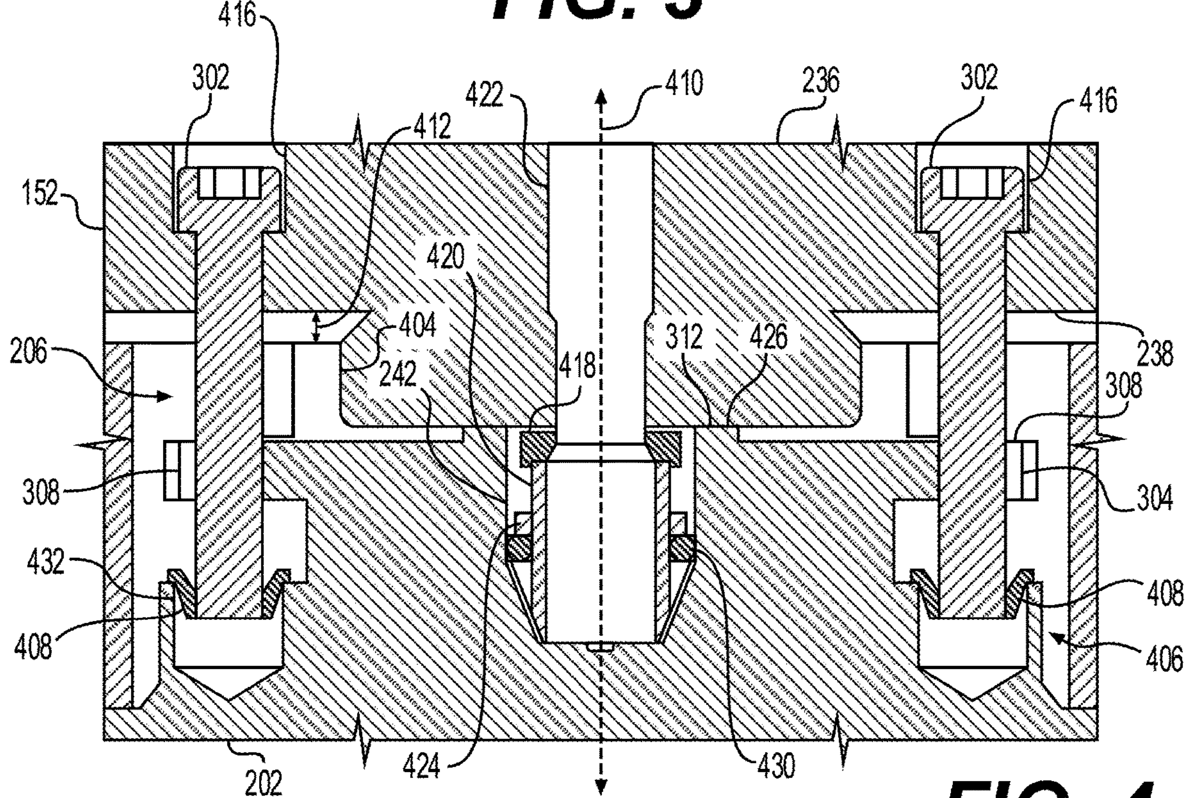
FIG. 4 depicts a cross-sectional view of a connection interface between a ceramic puck and a base plate assembly in accordance with at least some embodiments of the present disclosure.

FIG. 4 depicts a cross-sectional view of a connection interface between a ceramic puck and a base plate assembly in accordance with at least some embodiments of the present disclosure. In some embodiments, the ceramic puck 152 includes an interface ring 404 extending from the second side 238 of the ceramic puck 152. In some embodiments, the interface ring has an outer diameter of about 1.0 inch to about 1.7 inches. In some embodiments, a bottom surface of the interface ring 404 and a top surface of the raised lip 312 define a contact area between the base plate assembly 204 and the ceramic puck 152.

In some embodiments, a contact area 426 between the ceramic puck 152 and base plate assembly 204 is advantageously minimized to promote temperature uniformity of the ceramic puck 152. A larger contact area between the ceramic puck 152 and the base plate assembly 204 can lead to the base plate assembly 204 acting as a heat sink. In some embodiments, a gap 412 is disposed between the ceramic puck 152 and the base plate assembly 204 outside of the contact area 426 between the interface ring 404 and the central protrusion 216.

In some embodiments, a first tube 418 is coupled to the interface ring 404 radially inward from the contact area 426. In some embodiments, the first tube 418 is brazed or welded to the interface ring 404. In some embodiments, a second tube 420 is coupled to the first tube 418. In some embodiments, the second tube 420 is brazed or welded to the first tube 418. A central through hole 422 extends through the ceramic puck 152 (e.g., through the interface ring 404, the first tube 418, and the second tube 420) to provide a gas passage to the first side 236 of the ceramic puck 152 from the backside gas supply 141 via the central opening 242 of the base plate assembly 204.

In some embodiments, a seal 430 is disposed between the second tube 420 and sidewalls of the central opening 242 of the base plate assembly 204 to reduce or prevent gas leak. In some embodiments, the seal 430 is a canted spring. In some embodiments, the seal 430 is made of a metal alloy comprising nickel-chromium to provide electrical contact as well as a gas seal. In some embodiments, the second tube 420 includes an upper annular ledge 424 and a lower annular ledge 428 about a body of the second tube 420, with the seal 430 disposed therebetween. In some embodiments, the lower annular ledge 428 tapers radially inwards and downwards corresponding with a shape of the sidewalls of the central opening 242 so that the seal 430 is further compressed as the lower annular ledge 428 is urged downwards.

In some embodiments, the base plate assembly 204 includes lower tabs 406 extending radially outwards from the central protrusion 216. The each of the lower tabs 406 include an opening 432 to accommodate the fastener 302. Each opening 432 of the lower tabs 406 is aligned with a corresponding opening 304 of the upper tab 308. The upper tabs 308 are spaced from the lower tabs 406. In some embodiments, a floating nut 408 is partially disposed in each of the lower tabs 406.

In some embodiments, as shown in FIG. 4, two fasteners 302 are disposed in fastener openings 416 of the ceramic puck 152 to couple the ceramic puck 152 to the base plate assembly. In some embodiments, the two fasteners 302 are disposed about 0.8 inches to about 1.1 inches from a central axis 410 of the ceramic puck 152. Each of the fasteners 302 is disposed through the opening 304 in the upper tab 308 and into the floating nut 408 disposed in the lower tab 406. A diameter of the fastener 302 is less than a diameter of opening 304 and opening 432. The floating nut 408 advantageously allows the fastener 302 to move within the opening 304 and the opening 432 in response to thermal expansion of the ceramic puck 152 when heated to high temperatures.

Figure 5:
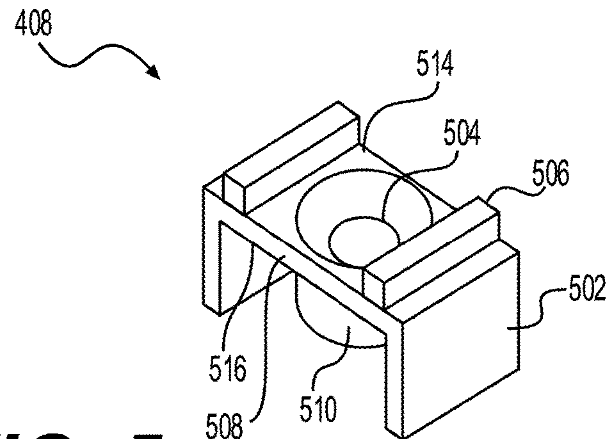
FIG. 5 depicts an isometric view of a floating nut in accordance with at least some embodiments of the present disclosure.

FIG. 5 depicts an isometric view of a floating nut 408 in accordance with at least some embodiments of the present disclosure. In some embodiments, the floating nut 408 includes a body 508 having an opening 504. In some embodiments, the opening 504 includes a countersunk hole to aid in self-centering the fasteners 302 when inserted from the top (e.g., during blind installation). The body 508 has an upper surface 514 and a lower surface 516. A central protrusion 510 extends from the lower surface 516 about the opening 504. An outer sidewall of the central protrusion 510 tapers radially inwards as the central protrusion 510 extends away from the body 508. The central protrusion 510 is sized to fit into the openings 432 of the lower tabs 406.

A pair of first legs 502 extend from the lower surface 516 on opposite sides of the opening 504. The pair of first legs 502 are spaced to straddle the lower tabs 406. A pair of second legs 506 extend from the upper surface 514 on opposite sides of the opening 504. In some embodiments, the pair of second legs 506 are disposed closer to the opening 504 than the pair of first legs 502. The pair of second legs 506 are spaced so that they are wider than the upper tabs 308. In use, the floating nut 408, when coupled to the fastener 302, can move in radial and axial directions while being retained between the upper tab 308 and the lower tab 406.

Figure 6:
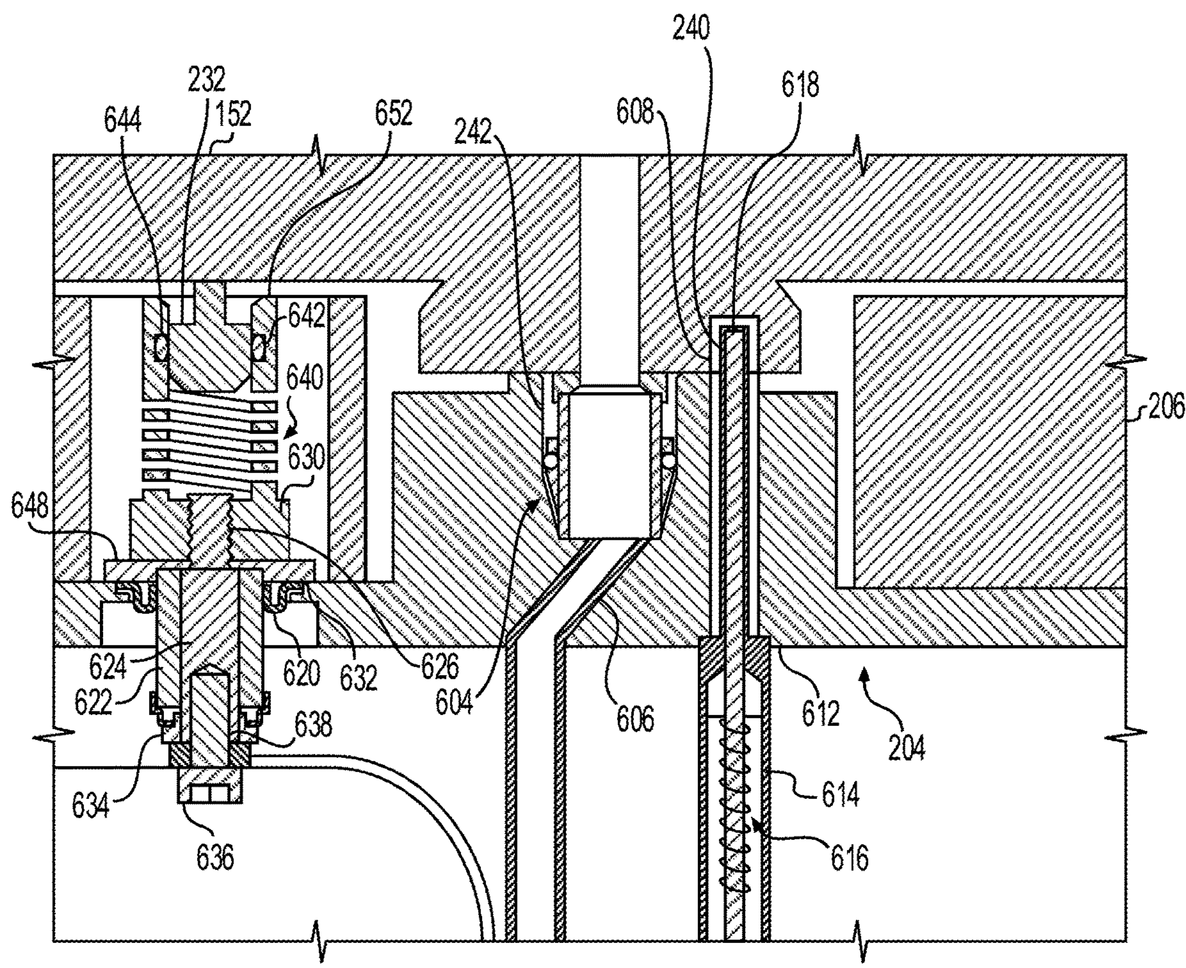
FIG. 6 depicts a cross-section view of a connection interface between a ceramic puck and a base plate assembly in accordance with at least some embodiments of the present disclosure.

FIG. 6 depicts a cross-section view of a connection interface between a ceramic puck and a base plate assembly in accordance with at least some embodiments of the present disclosure. In some embodiments, the thermocouple 240 is disposed through the central protrusion 216 of the base plate assembly 204 and partially through the ceramic puck 152. In some embodiments, the thermocouple 240 has a non-contact tip which picks up heat by radiation. In some embodiments, the thermocouple 240 is surrounded by a metallic sleeve 614. In some embodiments, a biasing element 616, such as a spring, is disposed about the thermocouple 240 to urge a top surface 618 of the thermocouple 240 towards the metallic sleeve 614. In some embodiments, the ceramic puck 152 has an opening 608 for the thermocouple 240 that is larger in diameter than an outer diameter of the thermocouple 240 to advantageously prevent the thermocouple 240 from contacting a sidewall of the opening 608 when the ceramic puck 152 undergoes thermal expansion and contraction.

In some embodiments, as shown in FIG. 7, the thermocouple 240 is a contact-type thermocouple. For example, the contact-type thermocouple may include a biasing element such as a spring, bellows, or the like, to press the top surface 618 of the thermocouple against the ceramic puck 152 to generate a temperature reading. In some embodiments, the biasing element 616 includes a spring member. In some embodiments, the biasing element includes a bellows 704. For example, the bellows 704 may be disposed between a first portion 710 of the metallic sleeve 614 and a second portion 720 of the metallic sleeve 614. In some embodiments, the base plate assembly 204 may include a hole to accommodate the thermocouple 240. In some embodiments, the hole extends through the central protrusion 216 from the upper surface 310.

Referring back to FIG. 6, in some embodiments, the thermocouple 240 is coupled to a lower surface 612 of the central plate 202. In some embodiments, the central opening 242 of the base plate assembly has a first portion 604 and a second portion 606. In some embodiments, the second portion 606 extends at an angle with respect to the first portion 604 and away from the thermocouple 240 to allow space for welding the thermocouple 240 to the lower surface 612 of the central plate 202.

In some embodiments, each of the plurality of electrical feedthroughs 228 include a conductive core 624 surrounded by a ceramic sleeve 622. In some embodiments, the conductive core 624 includes a threaded shaft 626 at one end. In some embodiments, the conduct core 624 includes a threaded opening 638 at an end opposite the threaded shaft 626. In some embodiments, a lead from a power supply (e.g., chucking power supply 140, heater power supply 180) is coupled to the conductive core 624 via a fastener 636 disposed through the threaded opening 638.

In some embodiments, a metal sleeve 620 is coupled to and disposed about the ceramic sleeve 622 near the one end proximate the threaded shaft 626. The metal sleeve 620 is coupled to the base plate assembly 204. In some embodiments, the metal sleeve 620 is U-shaped to accommodate any thermal expansion of the electrical feedthrough 228. In some embodiments, a washer 634 is disposed between the fastener 636 and the ceramic sleeve 622.

In some embodiments, a flexible connector 630 is disposed between each terminal 232 of the ceramic puck 152 and each of the plurality of electrical feedthroughs 228 to advantageously allow for radial movement of the terminal 232 with respect to the electrical feedthrough 228 due to thermal expansion of the ceramic puck 152 and for taking care of any positional inaccuracies between the ceramic puck terminal axes and electrical feedthrough axes on the base plate assembly.

In some embodiments, the flexible connector 630 includes an opening at a first end 652 to receive the terminal 232 extending from the ceramic puck 152. In some embodiments, the flexible connector 630 includes an opening at a second end 632 to receive the conductive core 624 of one of the plurality of electrical feedthroughs 228. In some embodiments, a ceramic washer 648 is disposed between the flexible connector 630 and the electrical feedthrough 228 to provide electrical isolation to ground. In some embodiments, the flexible connector 630 has a spiral portion 640 between the first end 652 and the second end 632. The spiral portion 640 is configured to advantageously allow the flexible connector 630 to flex when under a radial load (e.g., from thermal expansion) while maintaining electrical contact between the terminal 232 and the electrical feedthrough 228. In some embodiments, the flexible connector 630 is made of a metal alloy comprising nickel-chromium.

In some embodiments, the flexible connector 630 has an annular groove 644 about the terminal 232. In some embodiments, a biasing element 642 is disposed in the annular groove 644 to enhance electrical contact between the terminal 232 and the flexible connector 630. In some embodiments, the biasing element 442 is a canted spring. In some embodiments, the biasing element 442 is made of a metal alloy comprising nickel-chromium.

While the foregoing is directed to embodiments of the present disclosure, other and further embodiments of the disclosure may be devised without departing from the basic scope thereof.

The invention claimed is:

1. A substrate support for use in a substrate processing chamber, comprising:

a lower assembly having a base plate assembly, wherein the base plate assembly includes a plurality of electrical feedthroughs disposed about a central protrusion;

a ceramic puck disposed on the lower assembly and removably coupled to the base plate assembly, wherein the ceramic puck has an electrode disposed therein that is electrically coupled to a first pair of electrical feedthroughs of the plurality of electrical feedthroughs; and a plurality of flexible connectors, wherein each flexible connector includes a spiral portion disposed between the ceramic puck and respective ones of the plurality of electrical feedthroughs to allow for differences in thermal expansion of the ceramic puck and the base plate assembly, wherein the ceramic puck has an interface ring extending from a lower surface of the ceramic puck, wherein the interface ring includes a central through hole that is fluidly coupled to an opening in the central protrusion of the base plate assembly and configured to flow gas therethrough.

2. The substrate support of claim 1, wherein the ceramic puck is coupled to the lower assembly via fasteners, wherein each of the fasteners are coupled to a floating nut in the base plate assembly to allow for thermal expansion of the ceramic puck.

3. The substrate support of claim 2, wherein each of the fasteners are disposed through an opening in a tab that extends radially outwards from the central protrusion of the base plate assembly.

4. The substrate support of claim 1, wherein an isolator ring is disposed about the central protrusion and includes openings for the plurality of electrical feedthroughs to prevent arcing between adjacent electrical feedthroughs of the plurality of electrical feedthroughs.

5. The substrate support of claim 1, wherein a thermocouple is disposed through the central protrusion of the base plate assembly and extends into the ceramic puck.

6. The substrate support of claim 1, wherein the plurality of flexible connectors include an opening at a first end to receive a terminal extending from a lower surface of the ceramic puck and an opening at a second end to receive a conductive core of corresponding ones of the plurality of electrical feedthroughs.

7. The substrate support of claim 6, wherein the plurality of flexible connectors include an annular groove, and a canted spring is disposed between the annular groove and the terminal.

8. The substrate support of claim 1, wherein the ceramic puck includes one or more heating elements embedded therein, and wherein the one or more heating elements are electrically coupled to corresponding ones of the plurality of electrical feedthroughs.

9. A process chamber, comprising:

a chamber body having the substrate support of claim 1 disposed within an inner volume of the chamber body, wherein the substrate support further comprises:

a cooling plate configured to circulate a coolant therethrough, wherein the base plate assembly is disposed on the cooling plate.

10. The process chamber of claim 9, wherein the ceramic puck is coupled to the base plate assembly via fasteners, wherein each of the fasteners are coupled to a floating nut in the base plate assembly to allow for thermal expansion of the ceramic puck.

11. The process chamber of claim 9, wherein the plurality of electrical feedthroughs are disposed about a central protrusion of the base plate assembly.

12. The process chamber of claim 11, wherein a thermocouple having a spring member is disposed through the central protrusion of the base plate assembly and extends into the ceramic puck.

13. The process chamber of claim 9, further comprising a backside gas supply fluidly coupled to a first side of the ceramic puck via a central through hole of the ceramic puck and a central opening of the base plate assembly.

14. The process chamber of claim 9, wherein the base plate assembly includes a central plate and an outer lip, and wherein the cooling plate is disposed between the central plate and the outer lip.

15. A substrate support for use in a substrate processing chamber, comprising:

a base plate assembly, wherein the base plate assembly includes a central protrusion and a plurality of openings disposed about the central protrusion;

an electrical feedthrough disposed in each of the plurality of openings;

a ceramic puck removably coupled to the base plate assembly via fasteners coupled to a respective floating nut, wherein the ceramic puck has a first side for receiving a substrate and a second side opposite the first side having an interface ring extending from the second side, and wherein, when coupled, the base plate assembly and the ceramic puck contact each other only at an interface between the central protrusion and the interface ring;

an electrode embedded in the ceramic puck and electrically coupled to a first pair of the electrical feedthroughs; and a first resistive heater embedded in the ceramic puck and electrically coupled to a second pair of the electrical feedthroughs.

16. The substrate support of claim 15, further comprising a second resistive heater embedded in the ceramic puck and electrically coupled to a third pair of electrical feedthroughs.

17. The substrate support of claim 15, wherein each of the fasteners is disposed through an opening in an upper tab extending from the central protrusion and within an opening in a lower tab extending from the central protrusion, and wherein each floating nut is partially disposed in the opening of the lower tab.

18. The substrate support of claim 15, wherein each electrical feedthrough includes a conductive core surrounded by a ceramic sleeve.

19. The substrate support of claim 15, wherein a flexible connector is disposed between the ceramic puck and each electrical feedthrough to allow for thermal expansion of the ceramic puck while maintaining electrical coupling.

* * * * *